July 13, 1965 E. W. GRANT 3,195,065

TEMPERATURE STABILIZATION OF TRANSISTOR AMPLIFIERS

Filed June 26, 1963 2 Sheets-Sheet 1

INVENTOR.
EARL W. GRANT
BY Philip Subkow
ATTORNEY

July 13, 1965 E. W. GRANT 3,195,065

TEMPERATURE STABILIZATION OF TRANSISTOR AMPLIFIERS

Filed June 26, 1963 2 Sheets-Sheet 2

INVENTOR.
EARL W. GRANT
BY Philip Subkow
ATTORNEY 3,195,065

TEMPERATURE STABILIZATION OF TRANSISTOR AMPLIFIERS

Earl W. Grant, Los Angeles, Calif., assignor to Statham Instruments, Inc., Los Angeles, Calif., a corporation of California Filed June 26, 1963, Ser. No. 290,822
3 Claims. (Cl. 330—19)

Figure 1:
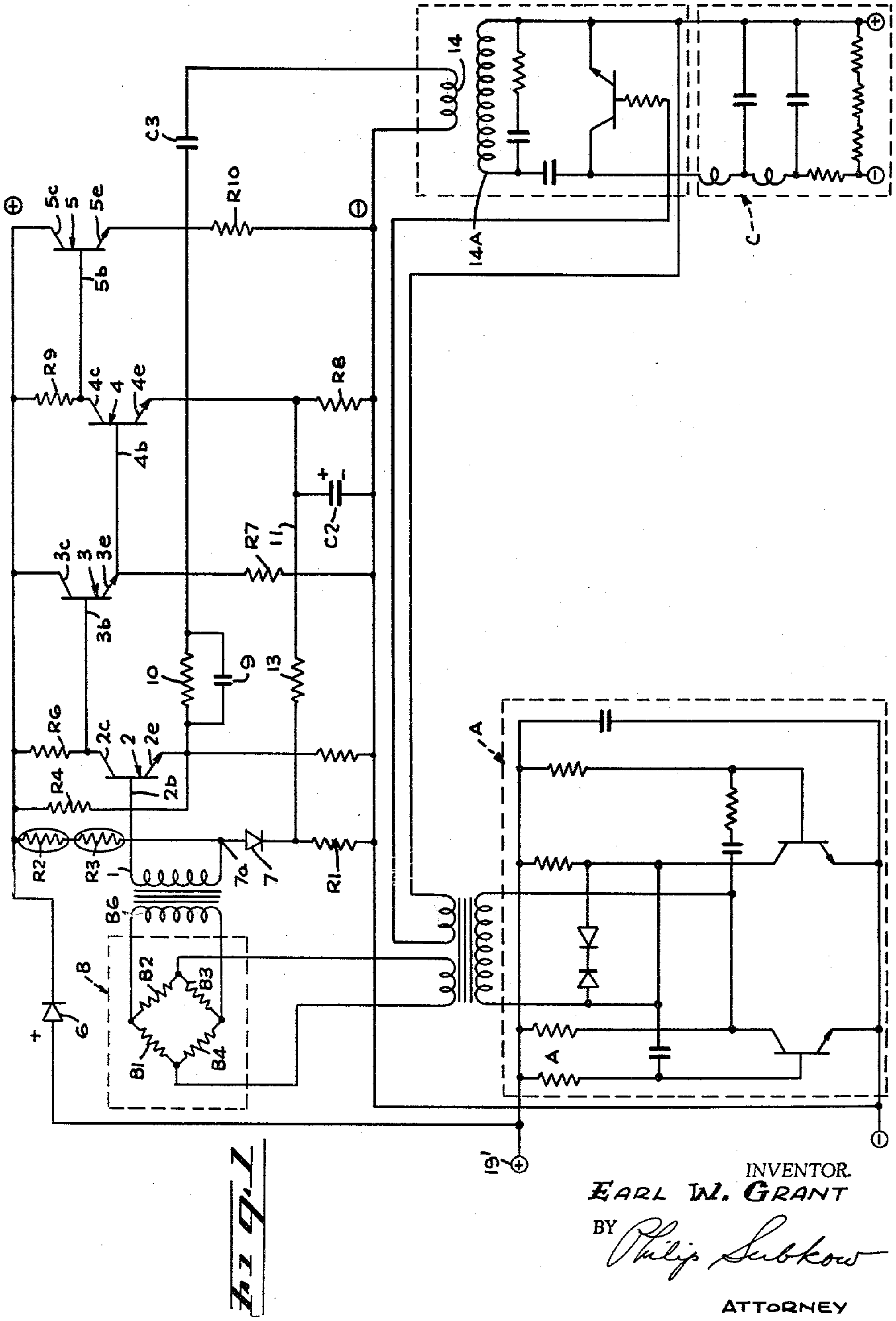

This invention relates to temperature stabilization of transistor amplifiers.

It is well known that voltage amplifiers employing semi-conductive transistors of the n.p.n. or p.n.p. type are temperature sensitive. This invention relates to the provision of temperature compensating networks in such amplifiers which compensate for variations in the parameters of the circuit due to changes in temperature of the components of the circuit. This application is a continuation-in-part of application Serial No. 11,846 filed February 29, 1960, now abandoned; Serial No. 744,757, filed June 26, 1958, now Patent No. 3,005,955; and 744,759, filed July 26, 1958, now Patent No. 3,005,958.

The amplifier which is stabilized by the networks of my invention may be of any conventional design or may include the feedback loop or loops employed in the design set forth in the aforesaid Patent No. 3,005,955, or as is herein described. In such amplifiers I establish across the power input terminals connected to the emitter and collector of the amplifying transistors, a temperature compensating network composed of resistances and a solid state diode connected in series. The diode has an impedance whose temperature dependence is similar to that of the transistors; and the remaining resistance of the compensating network changes in resistance so that, acting with the diode, the network establishes a potential at the positive pole of the diode whose value is maintained at a substantially constant ratio to the potential at the emitter of the transistor. The diode of the temperature compensating network is connected so that one of the poles of the diode is connected to a temperature sensitive resistance whose resistance changes with temperature to establish this constant ratio, and the other pole of the diode is connected to a resistance whose resistance changes but little with temperature. This network is shunted across the supply voltage source to which the collector and emitter of the transistors are connected through load and biasing resistances. Thus, the temperature sensitive resistor changes in resistance in a direction opposite to the change in resistance in the diode and, modified by the changes in the impedances in the rest of the circuit, will hold the collector to emitter potential substantially constant, at zero signal levels and constant applied voltage, irrespective of temperature changes.

The circuit may include one or more stages of amplification and/or impedance reduction, which may be directly connected. When there are more than one transistor connected in cascade, the potential at the positive pole of the diode of the temperature compensating network or networks varies with temperature so that the ratio of the potential at the positive pole of the diode is maintained at a substantially constant ratio to the potential of the base of the driver transistor, to which the temperature compensating network is connected. This ratio is in excess of 1, so that the changes in the temperature compensating network maintain the emitter potential on the final output transistor substantially constant. This is accomplished by selecting the values of the temperature sensitive and the temperature insensitive resistors of the temperature compensating network, so that, acting with the diode the potential between the emitter of the output transistor remains at a substantially constant value, at zero signal, the applied voltage being constant, irrespective of temperature changes.

I may, however, instead of connecting the stages directly, capacitatively couple the stages of amplification by a condenser which isolates each of the stages of amplification. In such case, I provide a separate temperature compensating network for each voltage amplification stage by connecting such a network across the voltage supply source in which emitter and collector electrodes of the amplifying transistors of each of the stages are connected. I employ a temperature compensating network similar in function to that described above across each of the capacitatively coupled transistor amplification stages. I may, in the second stage, employ as a part of the compensating network, a voltage divider which establishes the transistor bias and provides for a high impedance in the capacitor circuit and provides for shunting the collector and emitter by a diode-resistance network which functions in a manner similar to the diode resistance network across the amplifying transistor of Stage 1 described above.

Figure 2:
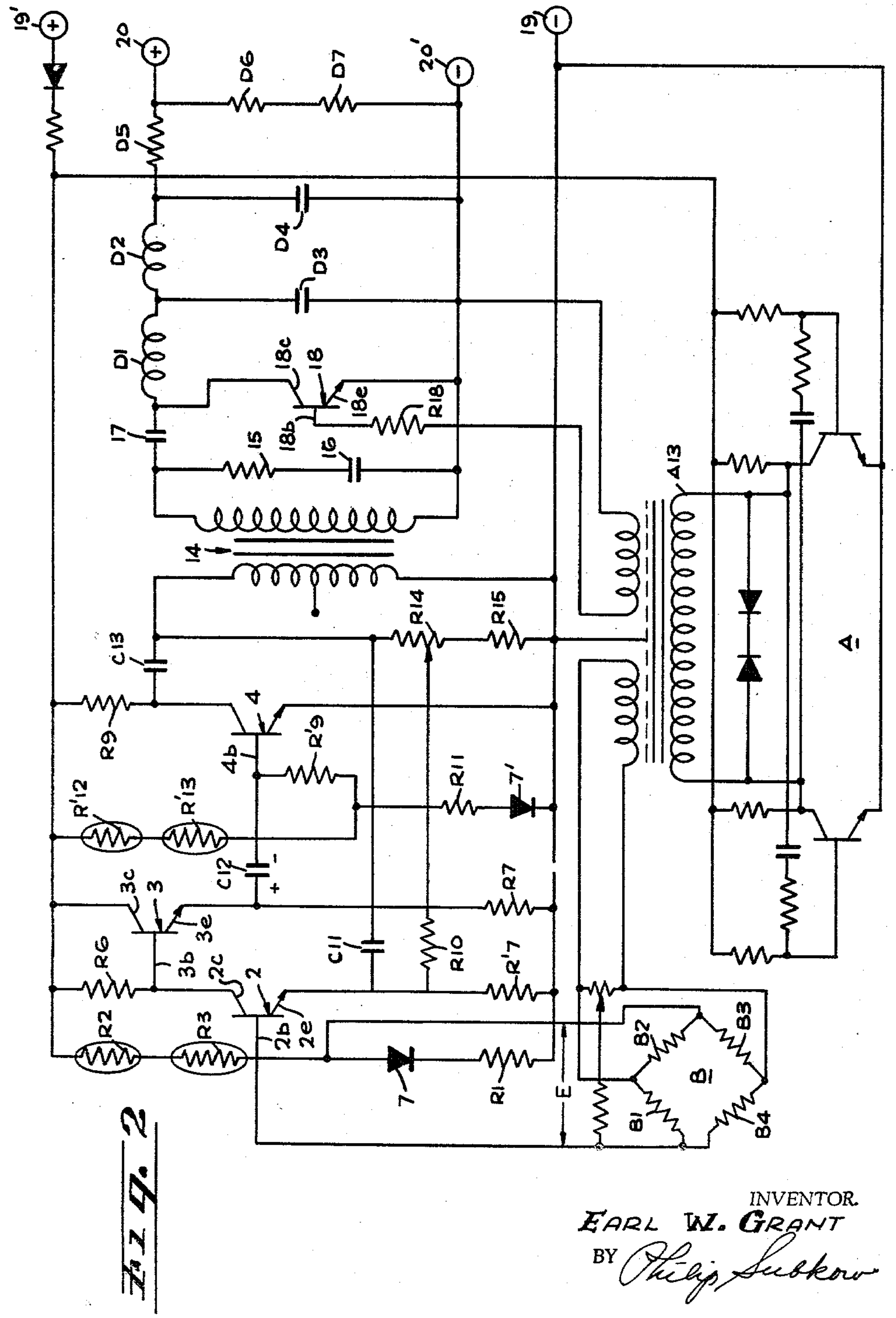

This invention will be further described in connection with the drawings, in which FIG. 1 shows a circuit diagram of one form of my invention; and FIG. 2 shows a circuit diagram of another form of my invention.

I have for purposes of illustration described my invention by showing its employment in a system in which the input to the amplifier is a modulated carrier frequency in which the carrier frequency is modulated by a bridge circuit such as, for example, that of a four-arm unbonded electrical resistance strain gage which modulates the carrier frequency.

As shown in the drawing, the bridge circuit included in the block diagram B whose output is shown at E has its input connected to a carrier frequency oscillator illustrated by the block A which, as is illustrated, is a conventional square pulse oscillator in the form of a flip-flop (multivibrator).

In FIG. 1 the output from the bridge illustrated in Block B is inductively coupled to the input of the amplifier of my invention.

In FIG. 1 the amplifier is formed of four n.p.n. transistors in cascade, composed of the driver transistor 2, connected in a common emitter configuration, and first impedance reducing transistor 3 connected in a common collector configuration, coupled to a second common emitter configuration transistor 4 and second impedance reducing transistor 5 connected in a common emitter configuration, both forming the second amplification stage, the four transistors forming four gain stages. The base of each transistor is marked with letter *b*, the emitter electrode as *e* and collector electrode *c*. Thus, the input is connected to 2*b*, 2*c* is connected to 3*b*, 3*e* is connected to 4*b* and 4*c* is connected to 5*b*.

In order to obtain the most advantageous results with the circuit of FIG. 1, it is necessary that each transistor of a cascade be selected so that their frequency response characteristics be of the character required for amplification. If this condition is not carefully regulated, and if transistors of improper frequency response characteristics are introduced into the circuit, the circuit may become an oscillator rather than an amplifier. By proper choice the R1, R2 and R3 and the diode 7, the potential drop across the diode to the negative terminal can be made to be a substantially constant ratio of the potenial between the emitter 2*e* and the negative terminal over practical ranges of temperature at zero signal input.

Potential changes at the base 2*b* are amplified and appear magnified at the base 5*b* of the transistor 5. The potential maintained by the temperature compensating network at *7a* establishes a higher potential than exists at *2b*, in an amount sufficient to compensate for the changes of potential due to temperature changes and appearing at *5e*, and thus maintains a substantially constant emitter current at 5.

The potential at the positive pole of the diode changes in an amount on variation in temperature affecting the system such that this change when multiplied by the gain of the amplifying circuit results, at zero signal, in a potential between the emitter *5e* of the last transistor (transistor 5), which is in a practical effect substantially constant irrespective of temperature changes. Thus, the potential established by the diode 7, when acting together with the resistances of the temperature compensating network, compensates for the changes in transistors 2 to 5 and associated circuit elements.

The temperature stability of the circuit, as well as its linearity, is improved by the negative feedback loop by connecting *5e* through the condenser 9 shunted by resistance 10, to the emitter electrode *2e*.

The direct current stability is also increased by the feedback loop 11, connecting through resistance 13 modified by the capacitor C2 whose opposite terminal is connected to the negative terminal.

The output of the amplifier appears at 14, connected through condenser C3 across resistance R10. The resistances R7, R8 are bias resistances, and R6, R9 and R10 are load resistances.

I have found that the employment of the feedback loop through 10 and 9, with or without 11 improves the stability and linearity of the amplifier. However, the use of the feedback loop 11 improves the direct current stability.

The circuit of FIG. 2 is similar in many respects to that of FIG. 1, and like elements bear the same lettering and numbering.

The circuit of FIG. 2 differs from the circuit of FIG. 1 in that the circuit is less sensitive to the frequency response characteristics of the transistors. The frequency response characteristics of the transistors vary considerably from transistor to transistor, even though they are of the same type and are produced by the same techniques.

The circuit of FIG. 2 escapes from the narrow limits imposed upon the design of the circuit of FIG. 1, and of prior art transistor amplifying circuits, and may employ transistors whose frequency response characteristics are not as closely matched, so that they together act as amplifying circuits rather than oscillators.

The first stage of amplification, composed of driver transistor 2 and the impedance reducing transistor 3, is the same in the circuit of FIG. 2 as it is in FIG. 1. Instead of connecting the bridge B to the base of the transistor 2 by a transformer, as in the case of FIG. 1, in the case of FIG. 2 it is directly connected. The emitter of transistor 3 in the case of FIG. 2 is capacitatively coupled through condenser C12 to the base of the transistor 4. The resistance-diode network, composed of resistances R2, R3, the semi-conductor diode 7 and R1 employed across the transistors 2 and 3 and connected to the power input terminals employed in FIG. 1, is also employed in the circuit of FIG. 2. The base *2b* is connected to one side of the bridge B, and the other side is connected between the upper and lower leg of the voltage divider as in FIG. 1. However, since the condenser C12 isolates transistors 2 and 3 from the transistor 4 connected in a common emitter configuration, the resistance network R2, R3, 7 and R1 compensates for the network ahead of the condenser C12, i.e., the transistors 2 and 3, as in the circuit of FIG. 1. These resistances have the temperature-resistance characteristics of the same kind as in the case of the similarly indicated resistances of the circuit of FIG. 1.

It will be noted that in the circuit of FIG. 2 the load is taken across the amplifying transistor 4 connected in a common emitter configuration in the manner described in connection with FIG. 1, i.e., that the impedance reducing transistor 5 has been omitted. The problem of selection of transistors of proper frequency response is reduced. The reduction in impedance effected by the transistor 5 of the circuit of FIG. 1 is supplied in FIG. 2 by using a primary of transformer 14 of a greater impedance than is necessary to be employed in the transformer 14 of the circuit of FIG. 1.

In order to obtain a maximum current output in the circuit of FIG. 2, it is necessary to operate the base of the transistor 4 at a potential substantially less than the potential existing at the emitter of the previous emitter follower stage, i.e., transistor 3. This is accomplished by a voltage divider whose upper leg is composed of resistances R'12, R'13 and condenser C12, and whose lower portion is composed of resistance R11 and the semi-conductor diode 7'. The voltage divider is connected to the base of the transistor 4 through the conductive resistance R9 associated with C12.

I employ this circuit to act also to stabilize the temperature characteristics of the amplifier circuit which follows the capacitor C12 by providing, in series with the diode 7' and the resistance R1, resistances R'12 and R'13. R'12 or R'13 may be resistances which change substantially with temperature, and R11 is one whose resistance does not change substantially with temperature.

The diode 7' compensates for the changes in resistance of the transistor 4 on variations in temperature in the same way as does the diode 7 in the case of transistor 2. The resistances R'12, R'13 and R11 act with the diode to stabilize the temperature sensitivity of the circuit following condenser C12 in the same way as does the temperature compensating network, including diode 7, in the system ahead of condenser C12.

The voltage divider establishes the D.C. bias potential for the transistor 4. R'9 affects the bias only in a secondary effect, see further below. The coupling network composed of condenser C12 and resistor R'9, plus the resistance of the previously mentioned voltage divider, form a high pass filter as follows: At zero frequency capacitor C12 has infinite reactance, and at infinitely high frequency the reactance of capacitor C12 will be zero ohm. Therefore, the frequency transmission across the condenser C12 will be proportional to the ratio of reactance of C12 to the resistance of resistor R'9, plus its added series resistance R11. Since the voltage divider is made up of a capacitance reactance and a shunt resistance, the voltage dividing action is a function of frequency. The object of this coupling network is to make resistance R'9 plus its associated series resistance R11 and diode 7' high in value compared to the capacity reactance of C12, so that C12 sees a high impedance.

The function of the resistance R9 is to keep the resistance high in the bottom leg of the voltage divider. The resistances are relatively low compared with R'9. The higher the resistance of R'9, the smaller the loss across the capacitor C12.

In the case of the compensating network across transistor 4, the voltage divider action establishes the bias for the transistor 4. This voltage drop across the diode 7' is in series with the lower leg of the divider. A variation in the voltage across 7' will result in a compensating change in voltage at transistor 4. By a control of the voltage drop, the collector potential may be maintained substantially constant. A like control is established by the voltage divider composed of R2, R3 and R1 and controls the voltage drop, the relation of the voltage at the positive pole of the diode 7 in relation to the potential at the base of the transistor 2 in the like manner.

A feedback connection gain control is provided by the variable resistance R14 which, with resistances R15 and R10, forms a voltage divider which controls the gain of the amplifier.

For completeness, I have shown the output 14 as fed to a synchronous demodulator and filter included in Block C, which is claimed in my Patent No. 3,005,955. The output at 14 may be otherwise employed.

As will be observed, the output at 14 is inductively coupled to the input of the demodulator 14A shunted by an RC network composed of the resistance 15 and capacitor 16. A capacitor 17 is provided, connected in series with the network composed of the RC network and the input inductance 14A. The base 18*b* of the transistor 18 is connected through resistance R18 to the output A13 of the carrier frequency oscillator A, which is also connected to the collector 18*e*. In the above circuit the transistor 18 shorts during one-half cycle of the square wave generated by the pulse oscillator A.

The output from the demodulator C passes through a filter. Any suitable filter may be employed. I have illustrated one with an M derived section followed by a constant K section, as shown schematically, where D1, D2 are inductances, D3 and D4 capacitors, and D5, D6, D7 and D8 resistances. 20 and 20′ are the output terminals.

Referring to the carrier frequency oscillator, the symbols as used are conventional; thus, A1, A2, A3, A4 and A5 are resistances, A6, A7 and A8 are capacitors, A11 and A12 are diodes. The carrier frequency square wave pulse appears at A13.

The modulator shown in block B is illustrated by a resistance bridge made up of resistances B1, B2, B3 and B4 where one or more than one and even all four resistances may be made responsive to some signal as in unbonded strain gage transducers. Trim resistors B6 and B7 may be employed as is conventional in such bridges and as are shown in FIG. 2. See, for example, U.S. Patents Nos. 2,573,286, 2,453,549, 2,600,701 and 2,760,037. The output of the carrier frequency oscillator is connected to the input B5, and the output B6 is inductively coupled to the input 1 of the amplifier.

All transistors as illustrated are n.p.n. transistors. Transistors of the p.n.p. type may also be employed by suitable rearrangement of polarities, as will be understood by those skilled in the art.

While I have described a particular embodiment of my invention for purposes of illustration, it should be understood that various modifications and adaptations thereof may be made within the spirit of the invention as set forth in the appended claims.

I claim:

1. An amplifier comprising a driver transistor stage and an output transistor, said driver stage connected in a common emitter configuration, a transistor connected in a common collector configuration, the base of the common collector transistor directly coupled to the collector of the driver transistor, said output transistor coupled to said common collector transistor, power input terminals connected to the emitters and collectors of said transistors, means to apply a signal to the base of the driver transistor, a voltage divider temperature compensating network coupled to said emitters and collectors and to said power terminals, one leg of said network comprising a solid state diode having a temperature resistance characteristic of the same kind as the temperature characteristics of resistance of said transistors, and a resistor whose resistance does not change substantially with temperature connected in series with said diode, and the other leg of said diode having a resistor whose resistance changes with temperature in a direction opposite to that of the said diode, the base of said driver transistor coupled to the voltage divider between said legs, whereby the emitter potential in said output transistor is maintained substantially constant, at zero signal levels and with constant voltage across said power input terminals, substantially irrespective of temperature changes.

2. In the circuit of claim 1, said output transistor comprising a transistor connected in a common emitter configuration coupled to the emitter of said transistor connected in common collector configuration.

3. In the circuit of claim 2, said output transistor capacitatively coupled to the said emitter of said transistor connected in common collector configuration, a second voltage divider, one leg of said voltage divider comprising a solid state diode whose resistance changes with temperature in the same manner as the said transistors, said diode connected in series with a resistor whose resistance is substantially constant with changes in temperature, and another leg comprising a resistance whose resistance varies with temperature in a direction opposite to that of the diode, said voltage divider coupled at a point between said legs by a conductive coupling to the base of said output transistor, whereby the potential at the collector electrode of the output transistor is maintained substantially constant, with changes in temperature, at substantially zero signal and substantially constant potential at said power input terminals.

References Cited by the Examiner

UNITED STATES PATENTS

| | | | |
|---|---|---|---|
| 2,831,114 | 4/58 | Van Overbeek | 330—24 |
| 2,832,900 | 4/58 | Ford | 330—24 X |
| 2,885,494 | 5/59 | Darlington | 330—24 |
| 2,892,165 | 6/59 | Lindsay | 330—23 X |
| 2,915,600 | 12/50 | Starke | 330—24 |

OTHER REFERENCES

Shea: "Principles of Transistor Circuits," September 1953, pages 178, 179.

ROY LAKE, *Primary Examiner.*

NATHAN KAUFMAN, *Examiner.*